(12) United States Patent
Gam et al.

(10) Patent No.: US 11,737,346 B2
(45) Date of Patent: Aug. 22, 2023

(54) POLYMER SEMICONDUCTORS, STRETCHABLE POLYMER THIN FILMS, AND ELECTRONIC DEVICES

(71) Applicant: Samsung Electronics Co., Ltd., Suwon-si (KR)

(72) Inventors: Sangah Gam, Seoul (KR); Jong Won Chung, Hwaseong-si (KR); Hyun Bum Kang, Yongin-si (KR); Youngjun Yun, Seongnam-si (KR); Yeongjun Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/745,155

(22) Filed: May 16, 2022

(65) Prior Publication Data
US 2022/0407008 A1    Dec. 22, 2022

(30) Foreign Application Priority Data
May 27, 2021    (KR) .................. 10-2021-0068648

(51) Int. Cl.
*C08G 61/00*    (2006.01)
*H01B 1/00*    (2006.01)
(Continued)

(52) U.S. Cl.
CPC ......... *H10K 85/113* (2023.02); *C08G 61/126* (2013.01); *C08J 5/18* (2013.01);
(Continued)

(58) Field of Classification Search
CPC .... H01B 1/121; C08G 61/124; C08G 61/126; C07D 487/04; H01L 31/0344; H01K 85/113
See application file for complete search history.

(56) References Cited

U.S. PATENT DOCUMENTS

| 5,200,528 A * | 4/1993 | Wooden ............... C07D 487/04 |
| | | 546/276.7 |
| 8,912,305 B2 | 12/2014 | Duggeli et al. |

(Continued)

FOREIGN PATENT DOCUMENTS

CN    103012751 A    4/2013

OTHER PUBLICATIONS

Huang et al "Organic and polymeric semiconductors enhanced by noncovalent conformational locks", Chem. Rev. 2017, 117, 10291-10318.*

(Continued)

*Primary Examiner* — Mark Kopec
(74) *Attorney, Agent, or Firm* — Harness, Dickey & Pierce, P.L.C.

(57) ABSTRACT

Provided are a polymer semiconductor including a first structural unit represented by Chemical Formula 1 and a second structural unit represented by Chemical Formula 2, a stretchable polymer thin film including the same, and an electronic device.

[Chemical Formula 1]

(Continued)

-continued

[Chemical Formula 2]

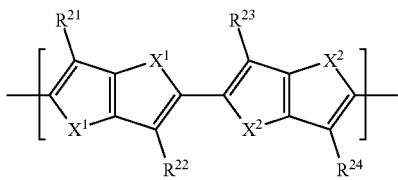

Definitions of Chemical Formulas 1 and 2 are as described in the detailed description.

15 Claims, 4 Drawing Sheets

(51) Int. Cl.
  *H10K 85/10* (2023.01)
  *C08G 61/12* (2006.01)
  *C08J 5/18* (2006.01)
  *H01B 1/12* (2006.01)
  *H10K 10/46* (2023.01)

(52) U.S. Cl.
  CPC ........... *H01B 1/121* (2013.01); *H10K 85/151* (2023.02); *C08G 2261/124* (2013.01); *C08G 2261/1412* (2013.01); *C08G 2261/18* (2013.01); *C08G 2261/228* (2013.01); *C08G 2261/3223* (2013.01); *C08G 2261/3241* (2013.01); *C08G 2261/3243* (2013.01); *C08G 2261/3244* (2013.01); *C08G 2261/92* (2013.01); *C08G 2261/94* (2013.01); *C08G 2261/95* (2013.01); *C08J 2365/00* (2013.01); *H10K 10/464* (2023.02); *H10K 10/466* (2023.02); *H10K 10/488* (2023.02)

(56) References Cited

U.S. PATENT DOCUMENTS

| | | |
|---|---|---|
| 9,663,611 B2 | 5/2017 | Yang et al. |
| 2015/0028265 A1 | 1/2015 | Yang et al. |
| 2015/0213966 A1* | 7/2015 | Holcombe ........... H01G 9/2059 548/453 |

OTHER PUBLICATIONS

Zhao et al "Heterocyclic building blocks for organic semiconductors", Advances in Heterocyclic Chemistry, Z vol. 121, 133-171.*
Bronstein et al "Thieno[3,2-b]thiophene=diketopyrrolopyrrole-containing polymers . . . ", J. Am. Chem. Soc. 2011, 133, 3272-3275.*
M. Shahid et al. "Low band gap selenophene-diketopyrrolopyrrole polymers exhibiting high and balanced ambipolar performance in bottom-gate transistors", Chemical Science (2012), 3(1), 181-185.

* cited by examiner

POLYMER SEMICONDUCTORS, STRETCHABLE POLYMER THIN FILMS, AND ELECTRONIC DEVICES

CROSS-REFERENCE TO RELATED APPLICATION

This application claims priority to and the benefit of Korean Patent Application No. 10-2021-0068648 filed in the Korean Intellectual Property Office on May 27, 2021, the entire contents of which are incorporated herein by reference.

BACKGROUND

1. Field

Polymer semiconductors, stretchable polymer thin films, and electronic devices are disclosed.

2. Description of the Related Art

In recent years, research on a stretchable display device or a bio-attachable device such as a smart skin device, a soft robot, and a biomedical device has been conducted. In addition to electrical characteristics, these devices should have stretchability in an arbitrary direction according to external movements, and at the same time should be able to maintain their original performance after being restored, and thus a new material suitable for this is required.

SUMMARY

Some example embodiments provide a polymer semiconductor having improved electrical properties such as charge mobility and stretchability.

Some example embodiments provide a stretchable polymer thin film including the polymer semiconductor.

Some example embodiments provide an electronic device including the polymer semiconductor or the stretchable polymer thin film.

According to some example embodiments, a polymer semiconductor includes a first structural unit represented by Chemical Formula 1 and a second structural unit represented by Chemical Formula 2.

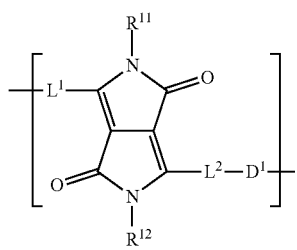

[Chemical Formula 1]

In Chemical Formula 1, $R^{11}$ and $R^{12}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, —COR$^a$, —OC(=O)R$^b$, —C(=O)OR$^c$, OC(=O)OR$^d$, a halogen, a cyano group, or any combination thereof, wherein R$^a$ to R$^d$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, a halogen, a cyano group, or any combination thereof, $L^1$ and $L^2$ are each independently a single bond, a substituted or unsubstituted C6 to C30 arylene group, a substituted or unsubstituted divalent C3 to C30 heterocyclic group, fused rings thereof, or any combination thereof, and $D^1$ is a substituted or unsubstituted C6 to C30 arylene group; a substituted or unsubstituted divalent C3 to C30 heterocyclic group including at least one of N, O, S, Se, Te, or Si; fused rings thereof, or any combination thereof.

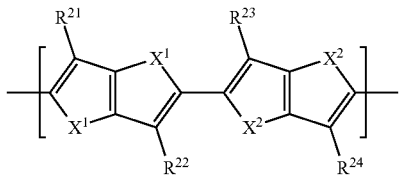

[Chemical Formula 2]

In Chemical Formula 2, $R^{21}$, $R^{22}$, $R^{23}$, and $R^{24}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, —COR$^a$, —OC(=O)R$^b$, —C(=O)OR$^b$, —OC(=O)OR$^d$, a halogen, a cyano group, or any combination thereof, wherein R$^a$ to R$^d$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, a halogen, a cyano group, or any combination thereof, $X^1$ and $X^2$ are each independently S, Se, or Te, and $X^1$ and $X^2$ are different from each other.

In some example embodiments, in Chemical Formula 1, $D^1$ may be at least one substituted or unsubstituted phenylene group; at least one substituted or unsubstituted naphthylene group; at least one substituted or unsubstituted anthracenylene group; at least one substituted or unsubstituted phenanthrenylene group; at least one substituted or unsubstituted pentagonal ring including at least one of N, O, S, Se, Te, or Si; a fused ring of two or more of the substituted or unsubstituted pentagonal rings; a fused ring of at least one of the substituted or unsubstituted pentagonal rings and at least one substituted or unsubstituted phenylene group; a fused ring of at least one substituted or unsubstituted pentagonal ring and at least one substituted or unsubstituted naphthylene group; a fused ring of at least one substituted or unsubstituted pentagonal ring and at least one substituted or unsubstituted anthracenylene group a fused ring of at least one substituted or unsubstituted pentagonal ring and at least one substituted or unsubstituted phenanthrenylene group; or any combination thereof.

In some example embodiments, in Chemical Formula 1, $D^1$ may be, for example, one electron-donating moiety of a group of electron-donating moieties of Group 1.

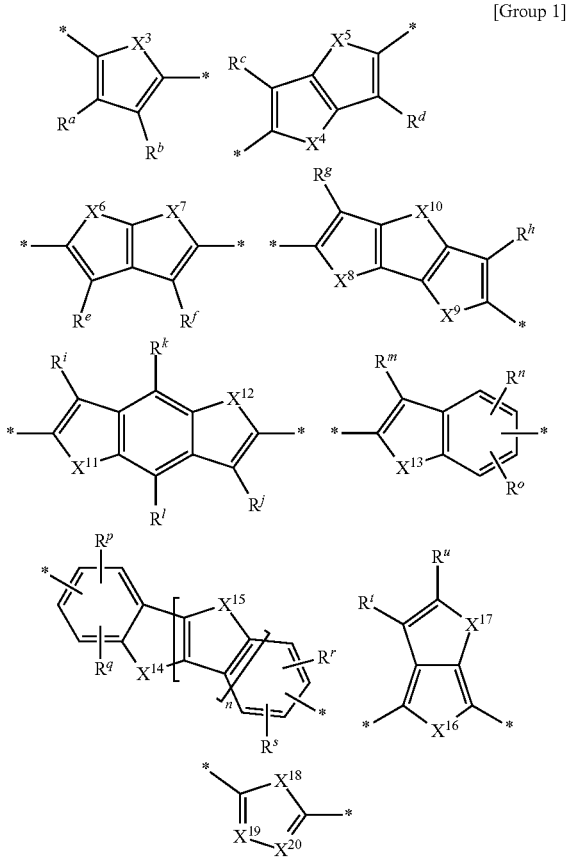

[Group 1]

In Group 1,

X$^3$ to X$^9$ and X$^{11}$ to X$^{18}$ are each independently O, S, Se, or Te,

X$^{10}$ is O, S, Se, Te, NR$^v$, CR$^w$R$^x$, or SiR$^y$R$^z$,

X$^{19}$ and X$^{20}$ are each independently N, CR$^{aa}$, or SiR$^{ab}$,

R$^a$ to R$^z$ and R$^{aa}$ to R$^{ab}$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or any combination thereof, n is 0, 1, or 2, and

* is a linking point with Chemical Formula 1.

In some example embodiments, in Chemical Formula 1, L$^1$ and L$^2$ may each independently be a single bond; one electron-donating moiety of the group of electron-donating moieties of Group 1; a substituted or unsubstituted pyridine; a substituted or unsubstituted pyrimidine; fused rings thereof; or any combination thereof.

In some example embodiments, in Chemical Formula 1, L$^1$ and L$^2$ may each independently be a divalent linking group including a single bond; at least one substituted or unsubstituted furan; at least one substituted or unsubstituted thiophene; at least one substituted or unsubstituted selenophene; at least one substituted or unsubstituted tellurophene; at least one substituted or unsubstituted pyrrole; at least one substituted or unsubstituted benzene; at least one substituted or unsubstituted pyridine; at least one substituted or unsubstituted pyrimidine; or a fused ring of two or more thereof; or any combination thereof.

In some example embodiments, in Chemical Formula 1, R$^{11}$ and R$^{12}$ may each independently be a substituted or unsubstituted C6 to C30 linear alkyl group or a substituted or unsubstituted C6 to C30 branched alkyl group.

In some example embodiments, in Chemical Formula 2, X$^1$ may be S and X$^2$ may be Se or Te.

In some example embodiments, in Chemical Formula 2, X$^1$ may be Se or Te and X$^2$ may be S.

In some example embodiments, in Chemical Formula 2, R$^{21}$, R$^{22}$, R$^{23}$, and R$^{24}$ may each independently be a substituted or unsubstituted C6 to C30 linear alkyl group or a substituted or unsubstituted C6 to C30 branched alkyl group.

The first structural unit and the second structural unit may be included in a molar ratio of about 1:9 to about 9:1.

According to some example embodiments, a stretchable polymer thin film including the polymer semiconductor is provided.

The stretchable polymer thin film may further include an elastomer.

The stretchable polymer thin film may be configured to exhibit a charge mobility change of less than or equal to about 10% in response to being stretched by about 30%.

According to some example embodiments, an electronic device including the stretchable polymer thin film is provided.

The electronic device may include an organic diode, an organic thin film transistor, or an attachable device.

The polymer may satisfy electrical characteristics such as charge mobility, and stretchability simultaneously, and thus may be effectively applied to stretchable electronic devices.

DETAILED DESCRIPTION

Figure 1:
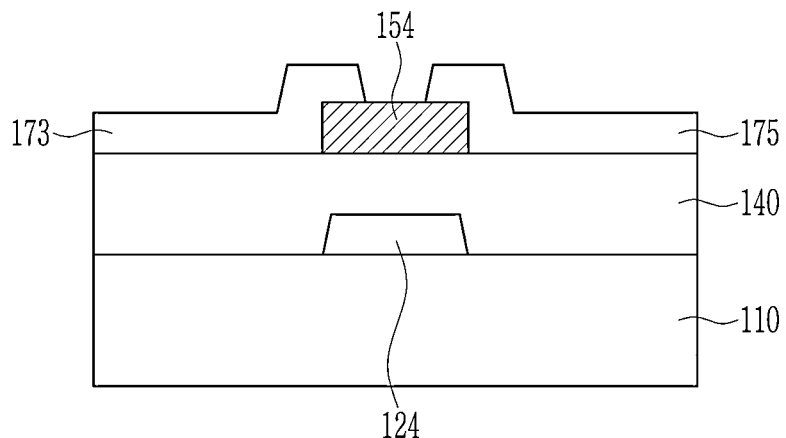
FIGS. 1, 2, and 3 are cross-sectional views each showing a thin film transistor according to some example embodiments.

According to some example embodiments, a polymer semiconductor includes a first structural unit represented by Chemical Formula 1 and a second structural unit represented by Chemical Formula 2.

Hereinafter, some example embodiments are described in detail so that those skilled in the art can easily implement them. However, the actual applied structure may be implemented in various different forms and is not limited to the implementations described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As used herein, when a definition is not otherwise provided, "substituted" refers to replacement of a hydrogen atom of a compound by at least one substituent of a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or any combination thereof.

As used herein, when a definition is not otherwise provided, "hetero" refers to one including 1 to 4 heteroatoms of N, O, S, Se, Te, Si, or P.

As used herein, when a definition is not otherwise provided, "alkyl group" may be a C1 to C30 (e.g., C1 to C20) linear or branched, saturated, monovalent hydrocarbon group (e.g., a methyl group, an ethyl group, a propyl group, an isobutyl group, a sec-butyl group, a tert-butyl group, a pentyl group, an iso-amyl group, a hexyl group, and the like).

As used herein, when a definition is not otherwise provided, "alkoxy group" may refer to a C1 to C30 (e.g., C1 to C20) alkyl group that is linked via an oxygen, e.g., a methoxy group, an ethoxy group, and a sec-butoxy group.

As used herein, when a definition is not otherwise provided, "aryl group" refers to a monovalent functional group formed by the removal of one hydrogen atom from one or more rings of a C6 to C30 (e.g., C6 to C20) arene, e.g., a phenyl group or a naphthyl group. The arene refers to a hydrocarbon having an aromatic ring, and includes monocyclic and polycyclic hydrocarbons wherein the additional ring(s) of the polycyclic hydrocarbon may be aromatic or nonaromatic.

As used herein, when a definition is not otherwise provided, "heterocyclic group" includes at least one heteroatom such as N, O, S, Se, Te, Si, or P in a ring such as a C6 to C30 (e.g., C6 to C20) aryl group, a C3 to C30 (e.g., C3 to C20) cycloalkyl group, a fused ring thereof, or any combination thereof, and the remaining carbon. When the heterocyclic group is a fused ring, a heteroatom may be included in the entire heterocyclic group or at least one of the rings.

As used herein, when a definition is not otherwise provided, "aromatic ring" refers to a functional group in which all atoms in the cyclic functional group have a p-orbital, and wherein these p-orbitals are conjugated. For example, the aromatic ring may be a (e.g., C6 to C20) C6 to C30 aryl group or C3 to C30 (e.g., C3 to C20) heteroaryl group.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the inventive concepts. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a device, layer, polymer semiconductor, element, region, or the like that is described as being "stretchable" will be understood to be elastic and/or configured to be elastic, such that the device, layer, polymer semiconductor, element, region, or the like is configured to be elastically deformed (e.g., stretched, compressed, subjected to strain, etc.) such that the device, layer, polymer semiconductor, element, region, or the like is configured to resume its same original shape after being deformed. For example, a stretchable device, layer, polymer semiconductor, element, region, or the like as described herein may be capable of being elastically deformed such that the stretchable device, layer, polymer semiconductor, element, region, or the like can resume, and does resume, an original shape after being stretched or compressed.

Hereinafter, a device, layer, polymer semiconductor, element, region, or the like that is described as being "non-stretchable" or "rigid" will be understood to be non-elastic and/or not configured to be elastic, such that the device, layer, element, region, or the like is configured to not be elastically deformed (e.g., stretched, compressed, subjected to strain, etc.) such that the device, layer, polymer semiconductor, element, region, or the like is configured to not resume its same original shape after being deformed. For example, a non-stretchable device, layer, polymer semiconductor, element, region, or the like as described herein may not be able to be elastically deformed due to applied strain such that the non-stretchable device, layer, polymer semiconductor, element, region, or the like cannot, and does not, resume an original shape after being stretched or compressed.

Hereinafter, a polymer semiconductor according to some example embodiments is described.

The polymer semiconductor according to some example embodiments may be a stretchable polymer, and may be a copolymer including a first structural unit and a second structural unit having different structures. The first structural unit may be a semiconducting structural unit having an electron accepting moiety and an electron-donating moiety, and the second structural unit may be a structural unit including different electron-donating moieties. The polymer semiconductor may exhibit semiconductor characteristics through an interaction between an electron-donating moiety and an electron accepting moiety.

The first structural unit may be a structural unit that provides improved electrical properties to the polymer semiconductor, and provides high charge mobility due to relatively high crystallinity, and the second structural unit may improve mobility and impart stretchability to the polymer semiconductor by strengthening intermolecular interaction and providing a long electron-donating moiety.

In some example embodiments, a polymer semiconductor including a first structural unit represented by Chemical Formula 1 and a second structural unit represented by Chemical Formula 2 is provided.

[Chemical Formula 1]

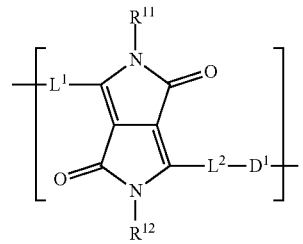

In Chemical Formula 1, $R^{11}$ and $R^{12}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, —COR$^a$, —OC(=O)R$^b$, —C(=O)OR$^c$, OC(=O)OR$^d$, a halogen, a cyano group, or any combination thereof, wherein $R^a$ to $R^d$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, a halogen, a cyano group, or any combination thereof, $L^1$ and $L^2$ are each independently a single bond, a substituted or unsubstituted C6 to C30 arylene group, a substituted or unsubstituted divalent C3 to C30 heterocyclic group, fused rings thereof, or any combination thereof, and $D^1$ is a substituted or unsubstituted C6 to C30 arylene group; a substituted or unsubstituted divalent C3 to C30 heterocyclic group including at least one of N, O, S, Se, Te, or Si; fused rings thereof; or any combination thereof.

[Chemical Formula 2]

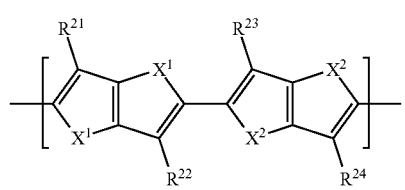

In Chemical Formula 2, $R^{21}$, $R^{22}$, $R^{23}$, and $R^{24}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, —COR$^a$, —OC(=O)R$^b$, —C(=O)OR$^c$, —OC(=O)OR$^d$, a halogen, a cyano group, or any combination thereof, wherein R$^a$ to R$^d$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, a halogen, a cyano group, or any combination thereof, $X^1$ and $X^2$ are each independently S, Se, or Te, and $X^1$ and $X^2$ are different from each other.

For example, in Chemical Formula 1, each of $R^{11}$ and $R^{12}$ may be relatively long linear alkyl group or bulky branched alkyl group. $R^{11}$ and $R^{12}$ may be for example independently a substituted or unsubstituted C6 to C30 linear alkyl group or a substituted or unsubstituted C6 to C30 branched alkyl group, or may be for example independently a substituted or unsubstituted C8 to C30 linear alkyl group or a substituted or unsubstituted C8 to C30 branched alkyl group, or a substituted or unsubstituted C10 to C30 linear alkyl group or a substituted or unsubstituted C10 to C30 branched alkyl group. Accordingly, the polymer semiconductor may have high solubility in organic solvents.

In Chemical Formula 1, $D^1$ may be a moiety having an electron-donating property, for example, a substituted or unsubstituted C6 to C30 arylene group; a substituted or unsubstituted divalent C3 to C30 heterocyclic group including at least one of N, O, S, Se, Te, or Si; fused rings thereof; or any combination thereof. For example, $D^1$ may be one or more substituted or unsubstituted phenylene groups; one or more substituted or unsubstituted naphthylene groups; one or more substituted or unsubstituted anthracenylene groups; one or more substituted or unsubstituted phenanthrenylene groups; one or more substituted or unsubstituted pentagonal rings including at least one of N, O, S, Se, Te, or Si; a fused ring of two or more of the substituted or unsubstituted pentagonal rings; a fused ring of one or more substituted or unsubstituted pentagonal rings and one or more substituted or unsubstituted phenylene groups; a fused ring of one or more substituted or unsubstituted pentagonal rings and one or more substituted or unsubstituted naphthylene groups; a fused ring of one or more substituted or unsubstituted pentagonal rings and one or more substituted or unsubstituted anthracenylene groups; a fused ring of one or more substituted or unsubstituted pentagonal rings and one or more substituted or unsubstituted phenanthrenylene groups; or any combination thereof.

In Chemical Formula 1, $D^1$ may be, for example, one electron-donating moiety of the group of electron-donating moieties of Group 1, but is not limited thereto.

[Group 1]

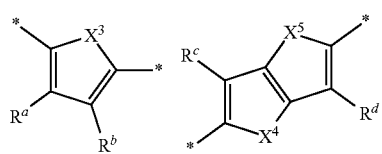

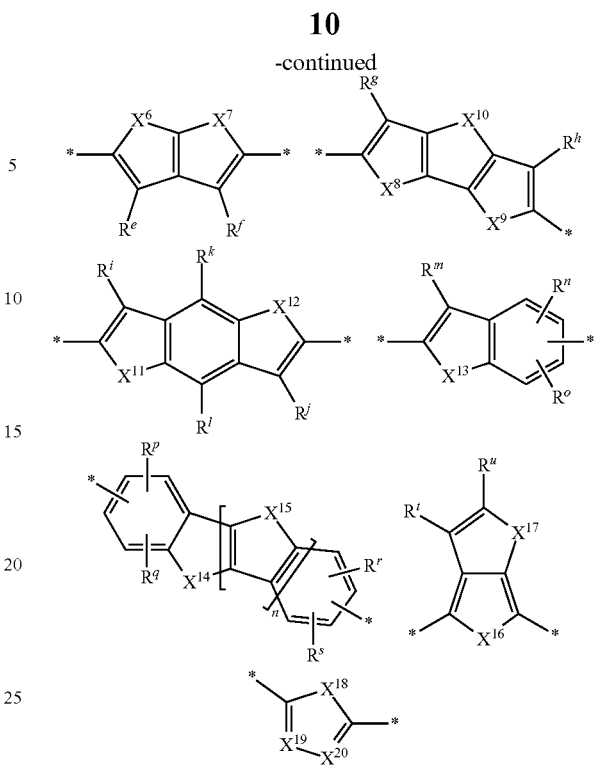

In Group 1, $X^3$ to $X^9$ and $X^{11}$ to $X^{18}$ are each independently O, S, Se, or Te, $X^{10}$ is O, S, Se, Te, NR$^v$, CR$^w$R$^x$, or SiRYRZ, $X^{19}$ and $X^{20}$ are each independently N, CR$^{aa}$, or SiR$^{ab}$, R$^a$ to R$^z$ and R$^{aa}$ to R$^{ab}$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or any combination thereof, n is 0, 1, or 2, and

* is a linking point with Chemical Formula 1 (e.g., a remainder of Chemical Formula 1).

In Chemical Formula 1, $L^1$ and $L^2$ may each independently be a single bond; one electron-donating moiety of the group of electron-donating moieties of Group 1; a substituted or unsubstituted pyridine; a substituted or unsubstituted pyrimidine; fused rings thereof; or any combination thereof.

For example, $L^1$ and $L^2$ may each independently be a divalent linking group including a single bond; at least one substituted or unsubstituted furan; at least one substituted or unsubstituted thiophene; at least one substituted or unsubstituted selenophene; at least one substituted or unsubstituted tellurophene; at least one substituted or unsubstituted pyrrole; at least one substituted or unsubstituted benzene; at least one substituted or unsubstituted pyridine; at least one substituted or unsubstituted pyrimidine; or a fused ring of the foregoing two or more (e.g., two or more thereof); or any combination thereof. For example, $L^1$ and $L^2$ may each be different from $D^1$.

For example $L^1$ and $L^2$ may be the same as or different from each other.

In some example embodiments, in Chemical Formula 2, $X^1$ may be S and $X^2$ may be Se or Te; or $X^1$ may be Se or Te and $X^2$ may be S.

In Chemical Formula 2, $R^{21}$, $R^{22}$, $R^{23}$, and $R^{24}$ may each independently be a substituted or unsubstituted C6 to C30 linear alkyl group or a substituted or unsubstituted C6 to C30 branched alkyl group.

The polymer semiconductor may be, for example, a random copolymer, a block copolymer, or an alternating copolymer.

The numbers of the first structural unit and the second structural unit in the polymer semiconductor may be 1 to 1000, 1 to 800, 2 to 1000, 2 to 800, 5 to 800, 5 to 700, 5 to 500, or 5 to 300, but are not limited thereto. For example, the sum of the number of the first structural unit and the second structural unit in the polymer may not exceed 2000.

The first structural unit and the second structural unit may be included in, for example, a mole ratio of about 1:9 to about 9:1, and within the range of about 2:8 to about 8:2, about 3:7 to about 7:3, about 4:6 to about 6:4 or about 5:5. Within the above range, electrical properties such as charge mobility and stretchability may be simultaneously implemented.

For example, the first structural unit may be included in a mole ratio equal to or higher than the second structural unit, and they may be included in a mole ratio of, for example, about 5:5 to about 9:1, about 6:4 to about 9:1, about 7:3 to about 9:1, or about 8:2 to about 9:1.

For example, the second structural unit may be included in a mole ratio equal to or higher than the first structural unit, and they may be included in a mole ratio of, for example, about 1:9 to about 5:5, about 2:8 to 5:5, or about 3:7 to 5:5.

In some example embodiments, the first structural unit may be included in an amount of greater than about 50 mol %, greater than or equal to about 55 mol %, greater than or equal to about 60 mol %, greater than or equal to about 65 mol %, greater than or equal to about 70 mol %, greater than or equal to about 75 mol %, or greater than or equal to about 80 mol % and less than or equal to about 90 mol %, less than or equal to about 89 mol %, less than or equal to about 88 mol %, less than or equal to about 87 mol %, less than or equal to about 86 mol %, or less than or equal to about 85 mol % based on the total content of the first structural unit and the second structural unit.

The polymer semiconductor may further include an additional structural unit different from the first structural unit and the second structural unit in addition to the first structural unit and the second structural unit. The additional structural unit may be at least one of the structural units of $D^1$ included in the first structural unit.

The polymer semiconductor may include, for example, structural units represented by Chemical Formulas 3A to 3D, but is not limited thereto.

[Chemical Formula 3A]

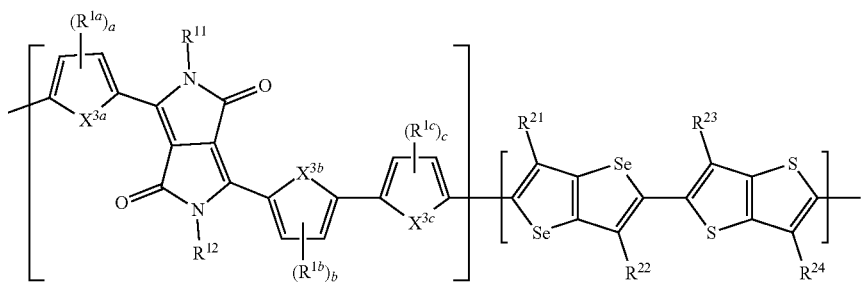

[Chemical Formula 3B]

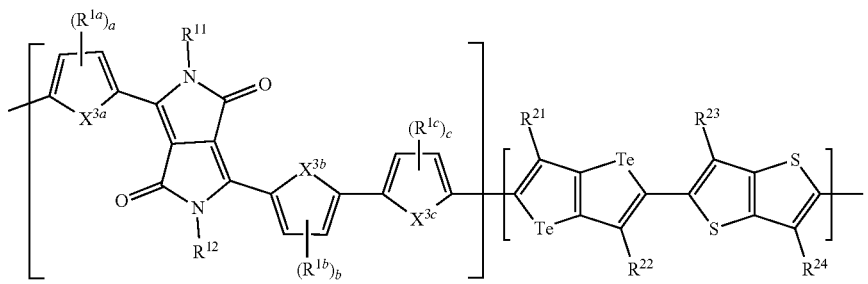

[Chemical Formula 3C]

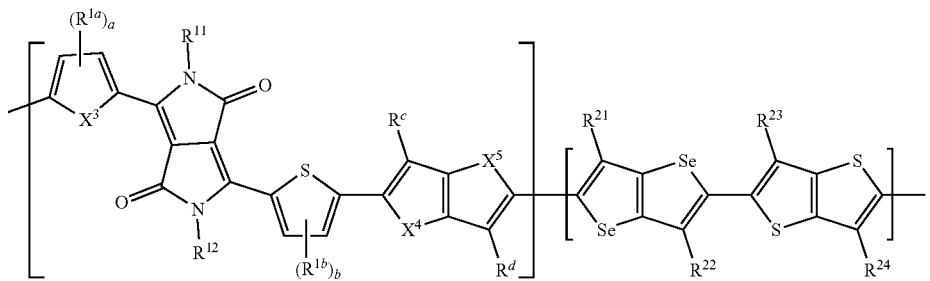

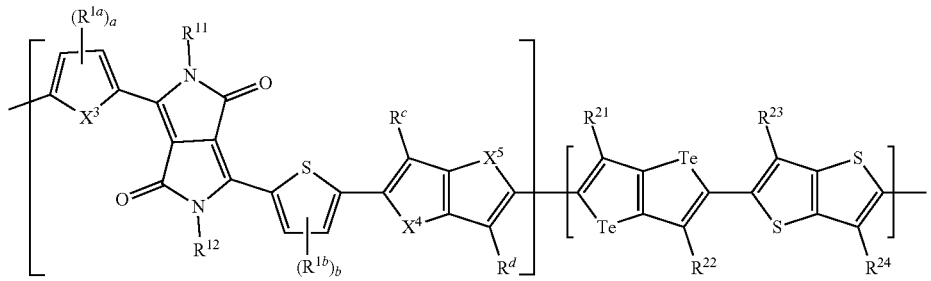

[Chemical Formula 3D]

In Chemical Formulas 3A to 3D, $X^{3a}$, $X^{3b}$, $X^{3c}$, $X^3$, $X^4$, and $X^5$ are each independently O, S, Se, or Te, $R^{1a}$, $R^{1b}$ and $R^{1c}$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or any combination thereof, a, b, and c are each independently an integer of 1 to 2, and $R^{11}$, $R^{12}$, $R^{21}$, $R^{22}$, $R^{23}$, and $R^{24}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, —COR$^a$, —OC(=O)R$^b$, —C(=O)OR$^c$, —OC(=O)OR$^d$, a halogen, a cyano group, or any combination thereof, wherein R$^a$ to R$^d$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, a halogen, a cyano group, or any combination thereof.

In the structural units of Chemical Formulas 3A to 3D, other structures of Group 1 may be included in the structures as the electron-donating moiety.

The polymer semiconductor may have a weight average molecular weight of greater than or equal to about 5,000 Da, greater than or equal to about 10,000 Da, greater than or equal to about 15,000 Da, or greater than or equal to about 20,000 Da and less than or equal to about 500,000 Da, less than or equal to about 450,000 Da, less than or equal to about 400,000 Da, less than or equal to about 350,000 Da, less than or equal to about 300,000 Da, or less than or equal to about 200,000 Da.

The aforementioned polymer semiconductor may be implemented as a thin film. The thin film may be a stretchable polymer thin film. The stretchable polymer thin film may flexibly respond to external forces or external movements such as twisting, pressing, and pulling due to the stretching characteristics of the polymer described above, and may be easily restored to its original state.

The elastic modulus of the stretchable polymer thin film may be, for example, less than about $10^7$ Pa, and within the above range, for example, may be greater than or equal to about 10 Pa and less than about $10^7$ Pa. For example, the elongation rate of the stretchable polymer thin film may be greater than or equal to about 10%, within the above range, about 10% to about 1000%, about 10% to about 800%, about 10% to about 500%, about 10% to about 300%, about 10% to about 200%, about 10% to about 100%, about 10% to about 90%, about 10% to about 80%, about 10% to about 70%, about 10% to about 60%, about 10% to about 50%, about 10% to about 40%, about 20% to about 70%, about 20% to about 60%, about 20% to about 50%, or about 20% to about 40%.

Herein, the elongation rate may be a percentage of a length change that is increased to a breaking point with respect to the initial length. For example, when the stretchable polymer thin film is stretched, the change in the electrical characteristics of the stretchable polymer thin film may be relatively small. For example, when the stretchable polymer thin film is stretched by about 30% (e.g., in response to the stretchable polymer thin film being stretched by about 30%), the change in the charge mobility of the stretchable polymer thin film may be less than or equal to about 10%, less than or equal to about 8%, less than or equal to about 7%, less than or equal to about 5%, less than or equal to about 3%, or less than or equal to about 2%, or less than or equal to about 1%, and may be equal to or greater than 0%, equal to or greater than about 0.01%, equal to or greater than about 0.1%, equal to or greater than about 0.2%, equal to or greater than about 0.5%, or equal to or greater than about 0.9%.

The stretchable polymer thin film may be a deposition thin film formed by vapor deposition or a coating thin film formed by a solution process. As described above, since the polymer semiconductor has good solubility in an organic solvent, the stretchable polymer thin film may be a coating thin film formed by a solution process.

The stretchable polymer thin film may further include a binder and/or an elastomer in addition to the aforementioned polymer.

The binder may improve the dispersibility of the aforementioned polymer, and may be, for example, polystyrene, but is not limited thereto.

The elastomer may be mixed with the aforementioned polymer to provide stretchability, and may include an organic elastomer, an organic/inorganic elastomer, an inorganic elastomer-like material, or any combination thereof. The organic elastomer or organic-inorganic elastomer may include a substituted or unsubstituted polyorganosiloxane such as polydimethylsiloxane; an elastomer including a substituted or unsubstituted butadiene moiety such as styrene-ethylene-butylene-styrene (SEBS), styrene-ethylene-propylene-styrene (SEPS), styrene-butadiene-styrene (SBS), styrene-isoprene-styrene (SIS), or styrene-isobutylene-styrene (SIBS); an elastomer including a urethane moiety, an elastomer including an acrylic moiety, an elastomer including an olefin moiety, or any combination thereof, but are not limited thereto. The inorganic elastomer-like material may include a ceramic having elasticity, a solid metal, a liquid metal, or any combination thereof, but is not limited thereto.

As described above, the stretchable polymer thin film may have high charge mobility while being stretchable by including a first structural unit providing stretchability and a second structural unit providing good electrical characteristics. Therefore, the stretchable polymer thin film may be applied to various electronic devices requiring stretchability and high charge mobility.

The electronic device may include, for example, an organic photoelectric device, an organic light emitting device, or an organic diode including an organic sensor; an organic thin film transistor; an attachable device such as a biometric sensor; or a device including any thereof or any combination thereof.

The electronic device may be applied to (e.g., included in) a bendable display panel, a foldable display panel, a rollable display panel, a wearable device, a skin-like display panel, a skin-like sensor, a large-area conformable display, smart clothing, and the like, but is not limited thereto.

The electronic device, and/or any portions thereof, may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of the electronic device and/or any portions thereof.

Hereinafter, an example of a thin film transistor including the aforementioned polymer or stretchable polymer thin film is described with reference to the drawings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
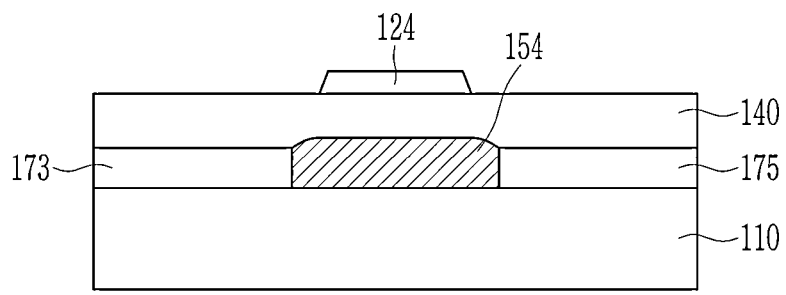
Figure 3:
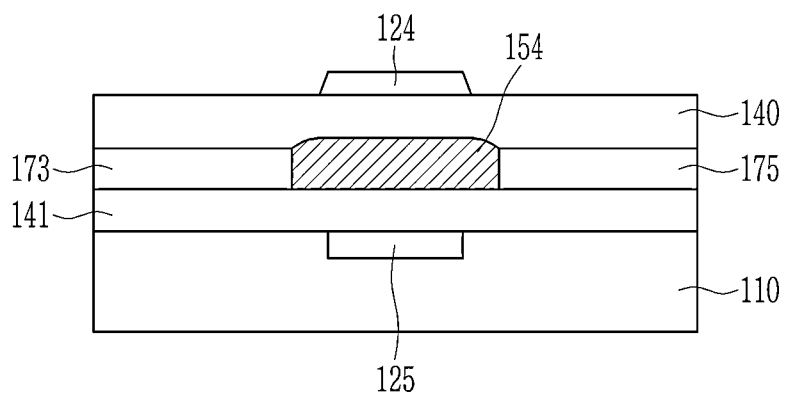

FIGS. 1, 2, and 3 are cross-sectional views each showing a thin film transistor according to some example embodiments.

Referring to FIGS. 1 to 3, a thin film transistor according to some example embodiments includes a gate electrode 124, an organic semiconductor 154 overlapped with the gate electrode 124, a gate insulating layer 140 between the gate electrode 124 and the organic semiconductor 154, and a source electrode 173 and a drain electrode 175 electrically connected to the organic semiconductor 154.

First, referring to FIG. 1, a thin film transistor according to some example embodiments may be a thin film transistor having a bottom gate and top contact structure. Specifically, a thin film transistor according to some example embodiments includes a gate electrode 124 on the substrate 110; a gate insulating layer 140 on the gate electrode 124; an organic semiconductor 154 on the gate insulating layer 140; and a source electrode 173 and a drain electrode 175 electrically connected to the organic semiconductor 154.

The gate electrode 124 is disposed on a substrate 110 made of transparent glass, silicon, or polymer. The gate electrode 124 is connected to a gate line (not shown) transferring a gate signal. The gate electrode 124 may be made of gold (Au), copper (Cu), nickel (Ni), aluminum (Al), molybdenum (Mo), chromium (Cr), tantalum (Ta), titanium (Ti), an alloy thereof, or a combination of these, but is not limited thereto.

The gate insulating layer 140 is disposed on the gate electrode 124. The gate insulating layer 140 may be made of an organic material or an inorganic material. Examples of the organic material may include a soluble polymer compound such as a polyvinyl alcohol-based compound, a polyimide-based compound, a polyacryl-based compound, a polystyrene-based compound, benzocyclobutane (BCB), styrene-ethylene-butylene-styrene (SEBS), and the like, and examples of the inorganic material may include a silicon nitride (SiNx) and silicon oxide ($SiO_2$).

The organic semiconductor 154 is disposed on the gate insulating layer 140. The organic semiconductor 154 may include the aforementioned polymer semiconductor, and may be the aforementioned stretchable polymer thin film. The organic semiconductor 154 may be formed by a solution process such as spin coating, slit coating, or inkjet printing by preparing the aforementioned polymer semiconductor in a solution form. The organic semiconductor 154 may be formed by vacuum evaporation or thermal evaporation of the aforementioned polymer semiconductor.

The source electrode 173 and drain electrode 175 are disposed on the organic semiconductor 154. The source electrode 173 and the drain electrode 175 face the gate electrode 124 on the organic semiconductor 154 as the center. The source electrode 173 is connected to a data line (not shown) transmitting a data signal. The source electrode 173 and the drain electrode 175 may include at least one metal selected from gold (Au), copper (Cu), nickel (Ni), aluminum (Al), molybdenum (Mo), chromium (Cr), tantalum (Ta), titanium (Ti), an alloy thereof, or any combination thereof, but is not limited thereto.

Referring to FIG. 2, the thin film transistor according to some example embodiments may be a thin film transistor having a top gate and top contact structure, unlike the some example embodiments, including the example embodiments shown in FIG. 1. Specifically, a thin film transistor according to some example embodiments includes an organic semiconductor 154 on the substrate 110; a source electrode 173 and a drain electrode 175 electrically connected to the organic semiconductor 154; a gate insulating layer 140 on the organic semiconductor 154, the source electrode 173, and the drain electrode 175; and a gate electrode 124 on the gate insulating layer 140.

Referring to FIG. 3, the thin film transistor according to some example embodiments may be a thin film transistor having a dual gate and bottom/top contact structure, unlike the some example embodiments, including the example embodiments shown in FIG. 1 and/or FIG. 2. Specifically, a thin film transistor according to some example embodiments includes an organic semiconductor 154 on the substrate 110; a first gate electrode 125 positioned under the organic semiconductor 154; a second gate electrode 124 positioned on the organic semiconductor 154; a first gate insulating layer 141 between the organic semiconductor 154 and the first gate electrode 125; a second gate insulating layer 140 between the organic semiconductor 154 and the second gate electrode 124; and a source electrode 173 and a drain electrode 175 electrically connected to the organic semiconductor 154. The first gate electrode 125 may be buried in the substrate 110 or may be formed by impurity doping. The first gate electrode 125, the organic semiconductor 154, and the second gate electrode 124 may be overlapped with each other.

Herein, examples of the thin film transistor have been described, but the present inventive concepts are not limited thereto and may be equally applied to thin film transistors having all structures.

The thin film transistor may be applied to various electronic devices as a switching device and/or a driving device. The electronic devices include, for example, a liquid crystal display device, an organic light emitting display device, a quantum dot display device, an electrophoretic display device, an organic photoelectric device, and an organic sensor, but is not limited thereto. The electronic device including the thin film transistor may be, for example, a flexible and stretchable electronic device, and may be a wearable device and/or a skin type device.

Some example embodiments will be described in more detail through the following examples. However, the following examples are for illustrative purposes and do not limit the scope of the rights.

Synthesis of Polymer Semiconductor

Synthesis Example 1: Synthesis of Polymer Including Structural Unit Represented by Chemical Formula A-1 (copolymer of 3-(5-(5-(5-(5-methylthieno[3,2-b]thiophen-2-yl)selenopheno[3,2-b]selenophen-2-yl)thieno[3,2-b]thiophen-2-yl)thiophen-2-yl)-6-(5-methylthiophen-2-yl)-2,5-bis(2-octyldodecyl)-2,5-dihydropyrrolo[3,4-c]pyrrole-1,4-dione)

[Chemical Formula A-1]

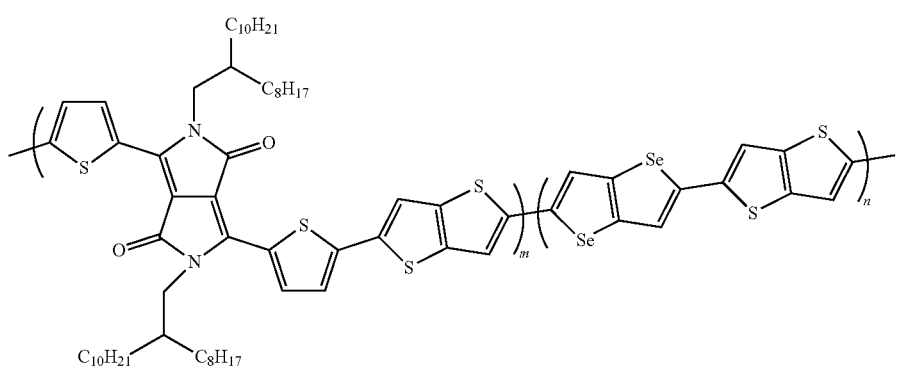

In Chemical Formula A-1, m and n represent a mole ratio of each structural unit, and m:n is 9:1.

Step 1: Synthesis of Compound (A-1b)

Compound (A-1b) (2,5-dibromoselenopheno[3,2-b]selenophene) is synthesized as follows.

[Reaction Scheme A-1b]

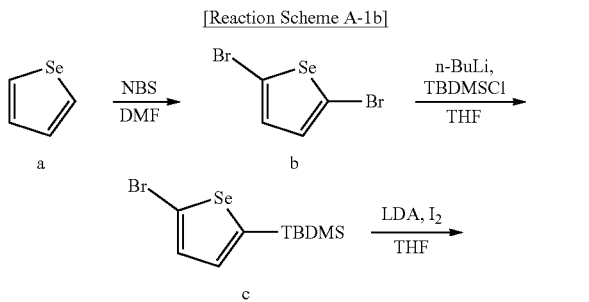

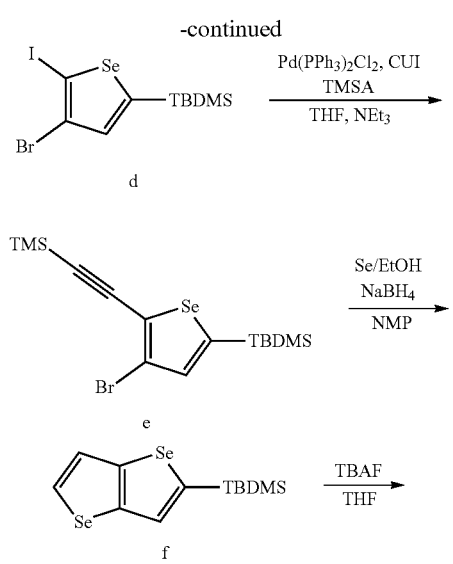

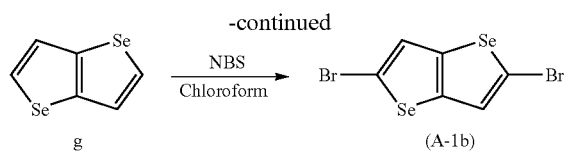

Selenophene (Compound (a)) is dissolved in dimethyl formamide (DMF), and N-bromosuccinimide (NBS) is added thereto at 0° C. and then, stirred at room temperature. Subsequently, a silica chromatography purification process (hexane 100%) is performed to obtain 2,5-dibromoselenophene (Compound (b)) in a total yield of 85% or more.

Subsequently, 2,5-dibromoselenophene (Compound (b)) is dissolved in a tetrahydrofuran (THF) solvent, n-butyllithium (n-BuLi) is added thereto at −80° C., and after 30 minutes, tert-butyldimethylsilyl chloride (TBMDSCl, 1 eq.) is added thereto and then, reacted, while maintaining the temperature, obtaining Compound (c) (yield >85%).

Compound (c) is dissolved in tetrahydrofuran (THF), lithium diisopropylamide (LDA) is added thereto at −80° C., after 2 hours, iodine is also added thereto, and the temperature is slowly increased to room temperature to proceed a reaction. Subsequently, a silica chromatography purification process (hexane 100%) is performed, obtaining Compound (d) in a yield of 85% or more.

Compound (d) is dissolved in a THF/triethylamine (Nets) (1:1, v/v) solvent, TMSA (trimethylsilylacetylene, 1.1 eq)/Pd(pph$_3$)Cl$_2$ (3 mol %)/CuI (6 mol %) are added thereto at room temperature, and then, the temperature is increased to 50° C. Subsequently, a silica chromatography purification process (hexane 100%) is performed, obtaining Compound (e) (a yield of 70% or more).

Selenium (Se; 376 mg, 4.757 mmol) is dispersed in 60 mL of ethanol. Subsequently, sodium borohydride (NaBH$_4$; 180 mg, 4.757 mmol) is slowly added thereto at 0° C. After 1 hour, Compound (e) (2.0 g, 4.757 mmol) dissolved in 240 mL of dry N-methyl-2-pyrrolidone is added thereto. Subsequently, the temperature is increased to 185° C. to stir the mixture for 20 minutes. While the temperature is increased, ethanol is drained with a dean stark. After sufficiently cooling the solution, 150 mL of an ammonium chloride saturated solution is added thereto and then, extracted with toluene and water, and an organic layer therefrom is dried with MgSO$_4$ and concentrated under a reduced pressure. Subsequently, a product therefrom is vacuum-dried for 1 hour, obtaining Compound (f).

Compound (f) is dissolved in 200 mL of dry tetrahydrofuran, and tetrabutyl ammonium fluoride (1 M in THF; 4.5 mL, 4.5 mmol) is added thereto at 0° C. After 10 minutes, water is added thereto, extraction is performed with chloroform and water, and an organic layer therefrom is dried with MgSO$_4$ and concentrated under a reduced pressure. Subsequently, a silica chromatography purification process (hexane 100%) is performed, obtaining Compound (g) in the form of a yellow solid (a yield <40%).

Compound (g) is dissolved in chloroform, and NBS (N-bromosuccin imide, 2.5 eq.) is added thereto at 0° C. and then, stirred. After about 1 hour, extraction is performed with chloroform and water, and an organic layer therefrom is dried with MgSO$_4$ and concentrated under reduced a pressure. Subsequently, a silica chromatography purification process (chloroform:hexane=a volume ratio of 20:80) is performed, obtaining Compound (A-1b) in the form of a yellow solid (a yield <40%).

Step 2: Synthesis of Polymer

[Reaction Scheme A-1]

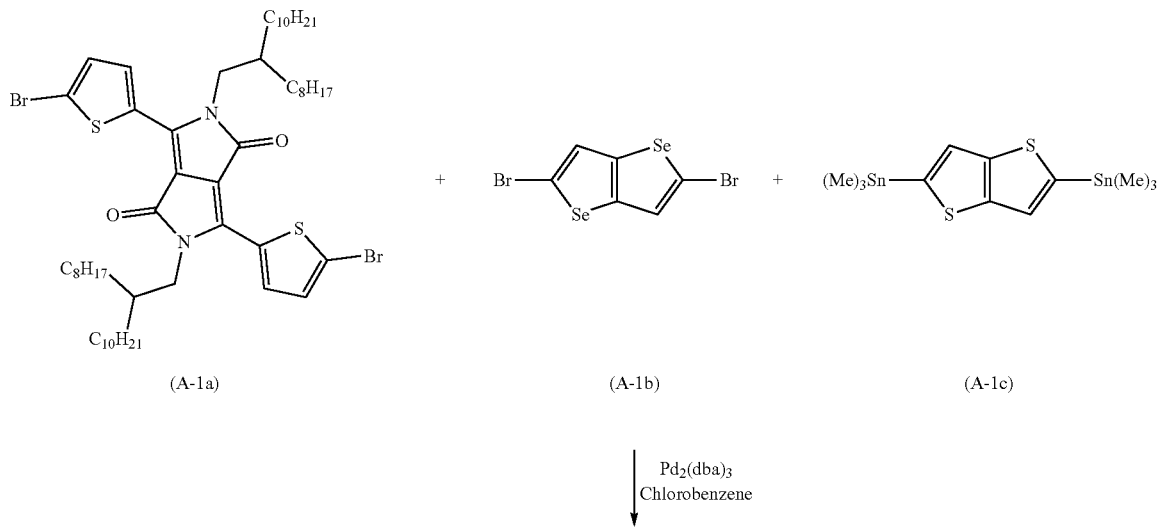

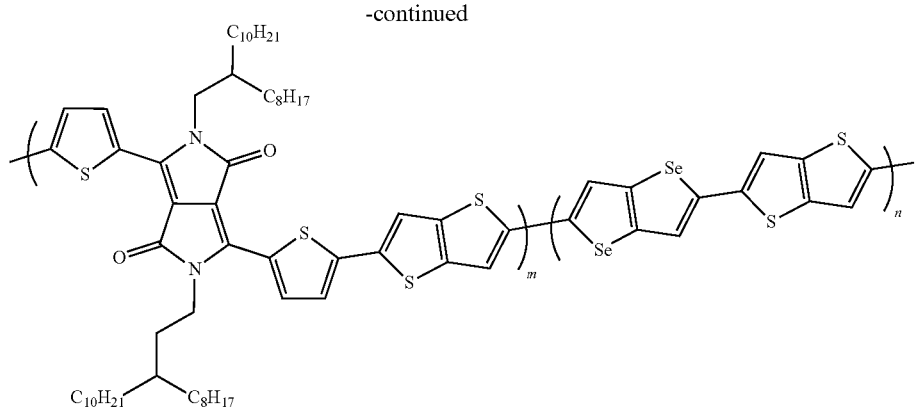

A-1

In a 100 ml flask, Compound (A-1a) (3,6-bis(5-bromo-thiophen-2-yl)-2,5-bis(2-octyldodecyl)-2,5-dihydropyrrolo[3,4-c]pyrrole-1,4-dione, 0.14 mmol), Compound (A-1 b) (2,5-dibromoselenopheno[3,2-b]selenophene, 0.015 mmol), Compound (A-1c) (2,5-bis(trimethylstannyl)thieno[3,2-b]thiophene, 0.15 mmol), $Pd_2(dba)_3$ (0.003 mmol), and tri(O-tolyl)phosphine (0.012 mmol) are dissolved in chlorobenzene (30 ml) under a nitrogen atmosphere and reacted for 16 hours by heating at 133° C. The resultant is cooled to room temperature and precipitated in methanol. Precipitates are extracted therefrom with methanol, acetone, dichloromethane, and chloroform through Soxhlet, and a material extracted in the chloroform is concentrated to obtain a polymer (copolymer) (a number average molecular weight=49,240). In the polymer including the structural unit represented by Chemical Formula A-1 in Synthesis Example 1, a mole ratio of m:n is 9:1.

$^1$H NMR is measured at room temperature using a Bruker AVANCE III HD 500 instrument. $^1$H NMR (500 MHz, CDCl3) δ 0.844-0.866 (m), 1.230-1.253 (m), 3.645, 7.050, 7.467, 7.522, 7.716.

Synthesis Example 2: Synthesis of Polymer Including Structural Unit Represented by Chemical Formula A-1

In a 100 ml flask, Compound (A-1a) (0.12 mmol), Compound (A-1b) (0.03 mmol), compound (A-1c) (0.15 mmol), $Pd_2(dba)_3$ (0.003 mmol), and tri(O-tolyl)phosphine (0.012 mmol) are dissolved in chlorobenzene (30 ml) under a nitrogen atmosphere and reacted for 16 hours by heating at 133° C. The resultant is cooled to room temperature and precipitated in methanol. Precipitates are extracted therefrom with methanol, acetone, dichloromethane, chloroform through Soxhlet, and a material extracted in the chloroform is concentrated, obtaining a polymer (copolymer) (a number average molecular weight=30,868). In the polymer including the structural unit represented by Chemical Formula A-1 according to Synthesis Example 2, a mole ratio of m:n is 8:2.

Synthesis Example 3: Synthesis of Polymer Including Structural Unit Represented by Chemical Formula A-1

In a 100 ml flask, Compound (A-1a) (0.3 mmol), Compound (A-1b) (0.3 mmol), Compound (A-1c) (0.6 mmol), $Pd_2(dba)_3$ (0.012 mmol), and tri(O-tolyl)phosphine (0.048 mmol) are dissolved in chlorobenzene (30 ml) under a nitrogen atmosphere and reacted for 16 hours by heating at 133° C. The resultant is cooled to room temperature and precipitated in methanol. Precipitates therefrom are extracted with methanol, acetone, dichloromethane, and chloroform through Soxhlet, and a material extracted in the chloroform is concentrated, obtaining a polymer (copolymer). (Number average molecular weight=25,149) In the polymer including the structural unit represented by Chemical Formula A-1 obtained in Synthesis Example 3, the mole ratio of m:n is 5:5.

$^1$H NMR is measured at room temperature using a Bruker AVANCE III HD 500 instrument. $^1$H NMR (500 MHz, CDCl$_3$) δ 0.844-0.866 (m), 1.230-1.253 (m), 3.645, 7.050, 7.467, 7.522, 7.716.

Comparative Synthesis Example 1: Synthesis of Polymer Including Structural Unit Represented by Chemical Formula B-1

[Chemical Formula B-1]

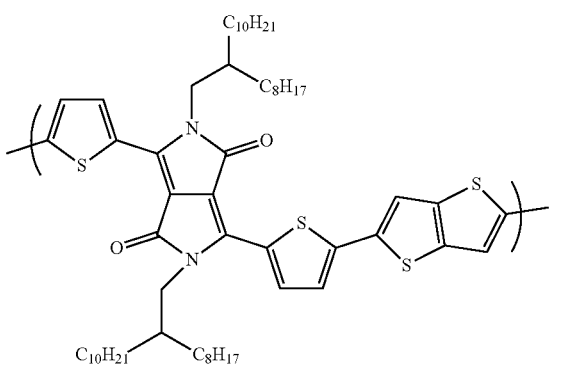

[Reaction Scheme B-1]

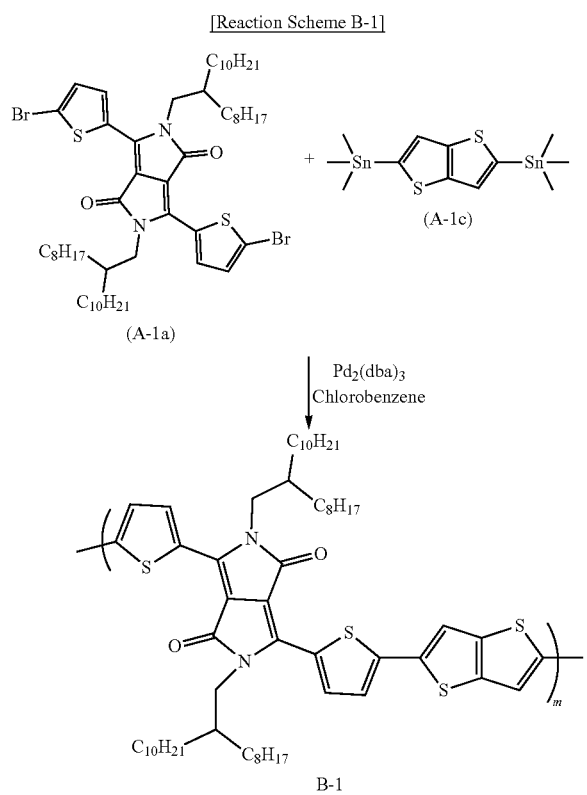

In a 100 ml flask, Compound (A-1a) (0.4 mmol), Compound (A-1c) (0.4 mmol), Pd$_2$(dba)$_3$ (0.008 mmol), and tri(O-tolyl)phosphine (0.032 mmol) are dissolved in chlorobenzene (20 ml) under a nitrogen atmosphere and reacted for 16 hours by heating at 133° C. The resultant is cooled to room temperature and precipitated in methanol. Precipitates are extracted therefrom with methanol, acetone, dichloromethane, and chloroform through Soxhlet, and a material extracted in the chloroform is concentrated, obtaining a polymer. (number average molecular weight=41,424)

$^1$H NMR is measured at room temperature using a Bruker AVANCE III HD 500 instrument. $^1$H NMR (500 MHz, CDCl3) δ 0.772-0.870 (m), 1.174-1.258 (m), 3.650, 7.055, 7.474.

Manufacture of Polymer Thin Film

Example 1

The polymer of Synthesis Example 1 is dissolved in chlorobenzene at a concentration of 0.6 wt %, preparing a solution. The solution is spin-coated at 2000 rpm for 30 seconds, forming a 200 Å-thick thin film. The obtained thin film is transferred to a PDMS (polydimethylsiloxane) film, manufacturing a polymer thin film.

Example 2

A polymer thin film is manufactured in the same manner as Example 1 except that the polymer of Synthesis Example 2 is used instead of the polymer of Synthesis Example 1.

Example 3

A polymer thin film is manufactured in the same manner as Example 1 except that the polymer of Synthesis Example 3 is used instead of the polymer of Synthesis Example 1.

Comparative Example 1

A polymer thin film is manufactured in the same manner as Example 1 except that the polymer of Comparative Synthesis Example 1 is used instead of the polymer of Synthesis Example 1.

Manufacture of Thin Film Transistor Example 4

A gate electrode is formed by thermally depositing Au on a styrene-ethylene-butylene-styrene (SEBS) substrate, and an SEBS solution is coated thereon and annealed at 100° C. for 0.5 hour to form a gate insulating layer. Subsequently, on the gate insulating layer, the polymer of Synthesis Example 1 and SEBS in a weight ratio of 4:6 are mixed in chlorobenzene at a concentration of 0.6 wt % to prepare an organic semiconductor solution, and the organic semiconductor solution is spin-coated to be 1000 Å thick at 1000 rpm and heat-treated under a nitrogen atmosphere at 130° C. for 1 hour, forming an organic semiconductor. Then, on the organic semiconductor, Au is thermally deposited to form a source electrode and a drain electrode, manufacturing a stretchable thin film transistor.

Example 5

A stretchable thin film transistor is manufactured according to the same method as Example 4 except that the polymer according to Synthesis Example 2 is used instead of the polymer according to Synthesis Example 1.

Example 6

A stretchable thin film transistor is manufactured according to the same method as Example 4 except that the polymer according to Synthesis Example 3 is used instead of the polymer according to Synthesis Example 1.

Comparative Example 2

A stretchable thin film transistor is manufactured according to the same method as Example 4 except that the polymer according to Comparative Synthesis Example 1 is used instead of the polymer according to Synthesis Example 1.
Evaluation I: Evaluation of Elongation Properties The polymer thin films according to Examples 1 to 3 and Comparative Example 1 are evaluated with respect to elongation properties by examining whether or not cracks are generated depending on an elongation rate (0% to 50%) with an optical microscope. The crack evaluation results of the polymer thin films according to Examples 2 and 3 and Comparative Example 1 according to elongation rates are respectively shown in FIGS. 4, 5, and 6.

Figure 4:
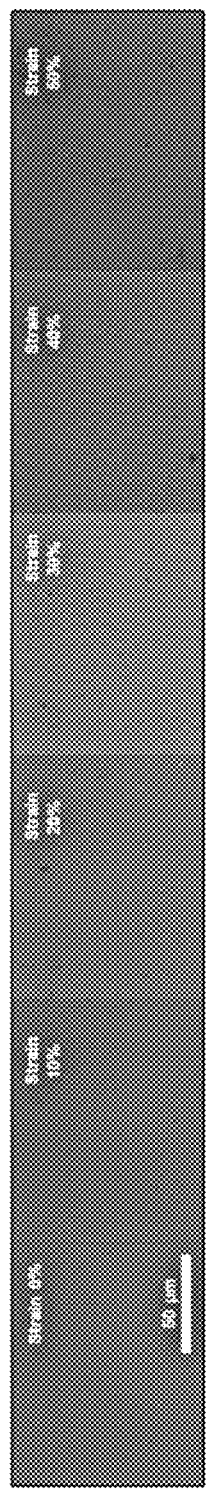
FIGS. 4, 5, and 6 are optical micrographs showing presence or absence of cracks according to the elongation of the polymer thin films according to Example 2, Example 3, and Comparative Example 1, respectively.
Figure 5:
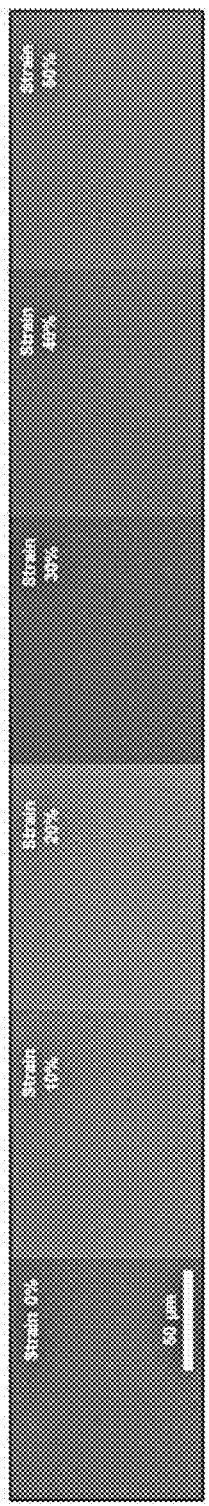
Figure 6:
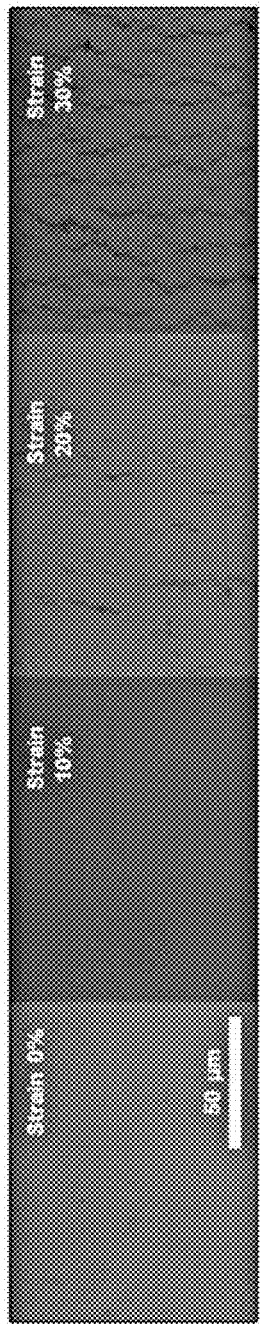

FIGS. 4, 5, and 6 are optical micrographs showing presence or absence of cracks according to the elongation rates of the polymer thin films according to Examples 2 and 3 and Comparative Example 1, respectively. Referring to FIGS. 4, 5, and 6, in the polymer thin film of Comparative Example 1, long cracks are generated at 20% strain, but in the polymer thin films of Examples 2 and 3, long cracks are not found even at 50%. Accordingly, the polymer thin films of Examples 2 and 3 exhibited excellent stretching properties compared with the polymer thin film of Comparative Example 1.

Evaluation II: Measurement of Charge Mobility

Charge mobility of the stretchable thin film transistors according to Examples 4 to 6 and Comparative Example 2 is measured using a Semiconductor Characterization System (4200-SCS) manufactured by KEITHLEY. Among them, the results of Examples 4 and 5 and Comparative Example 2 are shown in Table 1.

TABLE 1

| | Charge mobility (cm²/Vs) |
|---|---|
| Example 4 | 1.37 |
| Example 5 | 1.29 |
| Comparative Example 2 | 0.89 |

Referring to Table 1, the stretchable thin film transistors according to Examples 4 and 5 exhibit superior mobility compared to the stretchable thin film transistor of Comparative Example 2.

While the inventive concepts have been described in connection with what is presently considered to be practical example embodiments, it is to be understood that the inventive concepts are not limited to such example embodiments, but, on the contrary, are intended to cover various modifications and equivalent arrangements included within the spirit and scope of the appended claims.

DESCRIPTION OF SYMBOLS

110: substrate
124, 125: gate electrode
140, 141: gate insulating layer
154: organic semiconductor
173: source electrode
175: drain electrode

What is claimed is:

1. A polymer semiconductor, comprising:
a first structural unit represented by Chemical Formula 1 and a second structural unit represented by Chemical Formula 2:

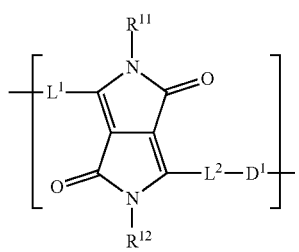

[Chemical Formula 1]

wherein, in Chemical Formula 1,
$R^{11}$ and $R^{12}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, —COR$^a$, —OC(=O)R$^b$, —C(=O)OR$^b$, —OC(=O)OR$^d$, a halogen, a cyano group, or any combination thereof, wherein R$^a$ to R$^d$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, a halogen, a cyano group, or any combination thereof,
$L^1$ and $L^2$ are each independently a single bond, a substituted or unsubstituted C6 to C30 arylene group, a substituted or unsubstituted divalent C3 to C30 heterocyclic group, fused rings thereof, or any combination thereof, and
$D^1$ is a substituted or unsubstituted C6 to C30 arylene group; a substituted or unsubstituted divalent C3 to C30 heterocyclic group including at least one of N, O, S, Se, Te, or Si; fused rings thereof, or any combination thereof,

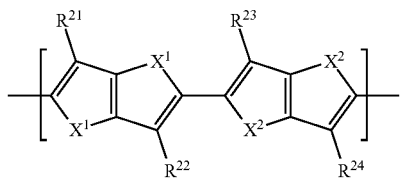

[Chemical Formula 2]

wherein, in Chemical Formula 2,
$R^{21}$, $R^{22}$, $R^{23}$, and $R^{24}$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, —COR$^a$, —OC(=O)R$^b$, —C(=O)OR$^b$, —OC(=O)OR$^d$, a halogen, a cyano group, or any combination thereof, wherein R$^a$ to R$^d$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C2 to C30 heteroaryl group, a halogen, a cyano group, or any combination thereof,
$X^1$ and $X^2$ are each independently S, Se, or Te, and
$X^1$ and $X^2$ are different from each other.

2. The polymer semiconductor of claim 1, wherein $D^1$ is one or more substituted or unsubstituted phenylene groups; one or more substituted or unsubstituted naphthylene groups; one or more substituted or unsubstituted anthracenylene groups; one or more substituted or unsubstituted phenanthrenylene groups; one or more substituted or unsubstituted pentagonal rings including at least one of N, O, S, Se, Te, or Si; a fused ring of two or more of the substituted or unsubstituted pentagonal rings; a fused ring of one or more substituted or unsubstituted pentagonal rings and one or more substituted or unsubstituted phenylene groups; a fused ring of one or more substituted or unsubstituted pentagonal rings and one or more substituted or unsubstituted naphthylene groups; a fused ring of one or more substituted or unsubstituted pentagonal rings and one or more substituted or unsubstituted anthracenylene groups; a fused ring of one or more substituted or unsubstituted pentagonal rings and one or more substituted or unsubstituted phenanthrenylene groups; or any combination thereof.

3. The polymer semiconductor of claim 1, wherein in Chemical Formula 1, $D^1$ is one electron-donating moiety of a group of electron-donating moieties of Group 1:

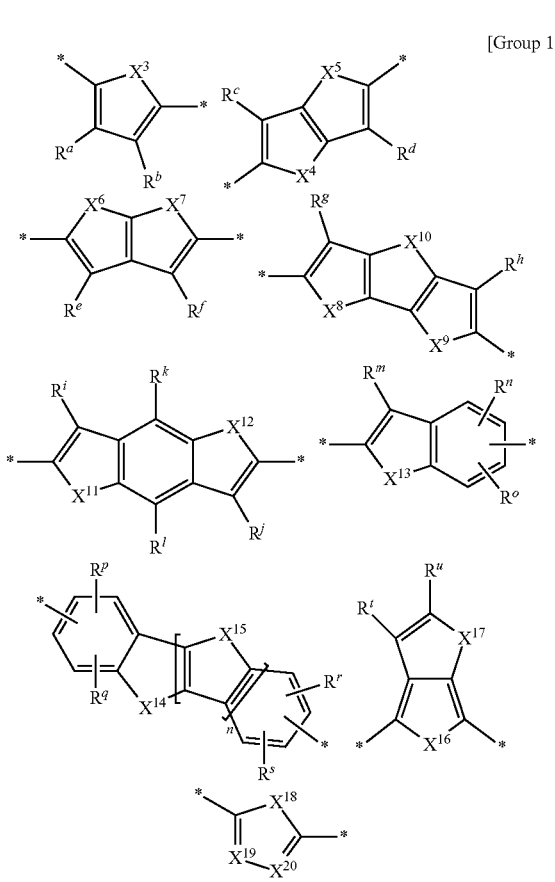

[Group 1]

wherein, in Group 1,
$X^3$ to $X^9$ and $X^{11}$ to $X^{18}$ are each independently O, S, Se, or Te,
$X^{10}$ is O, S, Se, Te, $NR^v$, $CR^wR^x$, or $SiR^yR^z$,
$X^{19}$ and $X^{20}$ are each independently N, $CR^{aa}$, or $SiR^{ab}$,
$R^a$ to $R^z$ and $R^{aa}$ to $R^{ab}$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or any combination thereof,
n is 0, 1, or 2, and
* is a linking point with Chemical Formula 1.

4. The polymer semiconductor of claim 1, wherein in Chemical Formula 1, $L^1$ and $L^2$ are each independently a single bond; one electron-donating moiety of a group of electron-donating moieties of Group 1; a substituted or unsubstituted pyridine; a substituted or unsubstituted pyrimidine; fused rings thereof; or any combination thereof:

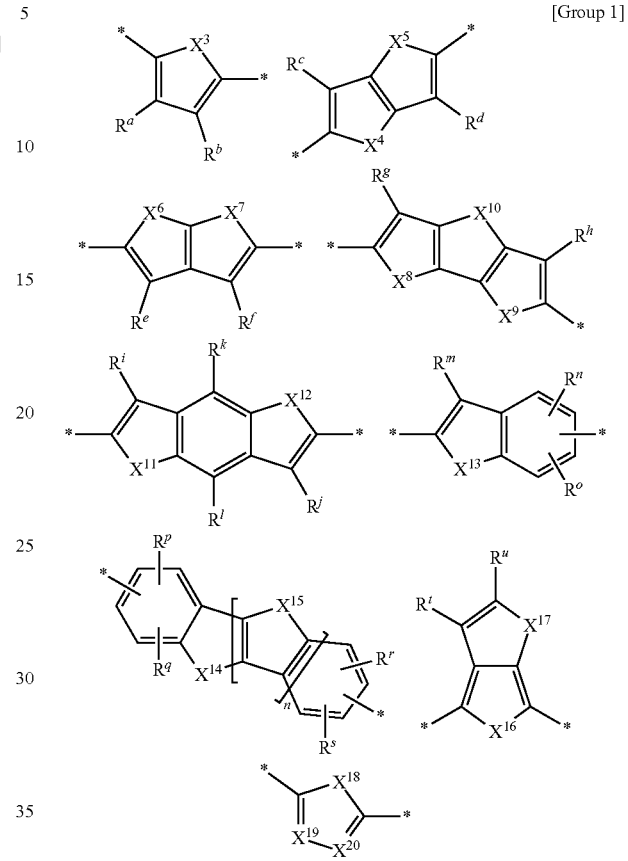

[Group 1]

wherein, in Group 1,
$X^3$ to $X^9$ and $X^{11}$ to $X^{18}$ are each independently O, S, Se, or Te,
$X^{10}$ is O, S, Se, Te, $NR^v$, $CR^wR^x$, or $SiR^yR^z$,
$X^{19}$ and $X^{20}$ are each independently N, $CR^{aa}$, or $SiR^{ab}$,
$R^a$ to $R^z$ and $R^{aa}$ to $R^{ab}$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C3 to C30 cycloalkenyl group, a substituted or unsubstituted C1 to C30 alkoxy group, a substituted or unsubstituted C3 to C30 cycloheteroalkyl group, a substituted or unsubstituted C3 to C30 cycloheteroalkenyl group, a substituted or unsubstituted C6 to C30 aryl group, a substituted or unsubstituted C7 to C30 alkylaryl group, a substituted or unsubstituted C6 to C30 aryloxy group, a substituted or unsubstituted C3 to C30 heterocyclic group, a halogen, a cyano group, or any combination thereof,
n is 0, 1, or 2, and
* is a linking point with Chemical Formula 1.

5. The polymer semiconductor of claim 1, wherein in Chemical Formula 1, $L^1$ and $L^2$ are each independently a divalent linking group including a single bond; at least one substituted or unsubstituted furan; at least one substituted or unsubstituted thiophene; at least one substituted or unsubstituted selenophene; at least one substituted or unsubstituted tellurophene; at least one substituted or unsubstituted pyrrole; at least one substituted or unsubstituted benzene; at least one substituted or unsubstituted pyridine; at least one substituted or unsubstituted pyrimidine; a fused ring of two or more thereof; or any combination thereof.

6. The polymer semiconductor of claim 1, wherein in Chemical Formula 1, $R^{11}$ and $R^{12}$ are each independently a substituted or unsubstituted C6 to C30 linear alkyl group or a substituted or unsubstituted C6 to C30 branched alkyl group.

7. The polymer semiconductor of claim 1, wherein in Chemical Formula 2, $X^1$ is S and $X^2$ is Se or Te.

8. The polymer semiconductor of claim 1, wherein in Chemical Formula 2, $X^1$ is Se or Te and $X^2$ is S.

9. The polymer semiconductor of claim 1, wherein in Chemical Formula 2, $R^{21}$, $R^{22}$, $R^{23}$, and $R^{24}$ are each independently a substituted or unsubstituted C6 to C30 linear alkyl group or a substituted or unsubstituted C6 to C30 branched alkyl group.

10. The polymer semiconductor of claim 1, wherein the first structural unit and the second structural unit are included in a mole ratio of 1:9 to 9:1.

11. A stretchable polymer thin film comprising the polymer semiconductor of claim 1.

12. The stretchable polymer thin film of claim 11, wherein the stretchable polymer thin film further comprises an elastomer.

13. The stretchable polymer thin film of claim 11, wherein the stretchable polymer thin film is configured to exhibit a change in charge mobility of less than or equal to about 10% in response to being stretched by about 30%.

14. An electronic device comprising the stretchable polymer thin film of claim 11.

15. The electronic device of claim 14, comprising an organic photoelectric device, an organic light emitting device, an organic diode, an organic thin film transistor, or an attachable device.

* * * * *